United States Patent
Ikesho

(10) Patent No.: US 10,962,434 B2
(45) Date of Patent: Mar. 30, 2021

(54) SENSOR DEVICE UTILIZING ADHESIVES AND MANUFACTURING METHOD THEREOF

(71) Applicant: FUJI ELECTRIC CO., LTD., Kanagawa (JP)

(72) Inventor: Hiroki Ikesho, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 159 days.

(21) Appl. No.: 16/258,508

(22) Filed: Jan. 25, 2019

(65) Prior Publication Data
US 2019/0285499 A1   Sep. 19, 2019

(51) Int. Cl.
*G01L 19/14*   (2006.01)
*G01L 9/04*   (2006.01)
*H01L 23/00*   (2006.01)
*H01L 29/84*   (2006.01)
*G01L 7/18*   (2006.01)

(52) U.S. Cl.
CPC .............. *G01L 19/14* (2013.01); *G01L 7/182* (2013.01); *G01L 9/04* (2013.01); *H01L 24/30* (2013.01); *H01L 24/33* (2013.01); *H01L 24/49* (2013.01); *H01L 24/73* (2013.01); *H01L 29/84* (2013.01); *H01L 2224/48091* (2013.01); *H01L 2224/49175* (2013.01); *H01L 2224/73265* (2013.01)

(58) Field of Classification Search
USPC ................................................... 73/700–756
See application file for complete search history.

(56) References Cited

U.S. PATENT DOCUMENTS

| | | | | |
|---|---|---|---|---|
| 5,667,884 | A * | 9/1997 | Bolger | H01L 21/563 428/323 |
| 2005/0133932 | A1* | 6/2005 | Pohl | H01L 23/3128 257/777 |
| 2015/0115433 | A1* | 4/2015 | Lin | H01L 23/3675 257/712 |
| 2016/0351541 | A1* | 12/2016 | Fukayama | H01L 24/14 |
| 2017/0047266 | A1* | 2/2017 | Ihara | H01L 23/367 |
| 2018/0184538 | A1* | 6/2018 | Bayerer | H01L 23/3735 |
| 2018/0238928 | A1* | 8/2018 | Ueno | F02D 41/18 |
| 2019/0285498 | A1* | 9/2019 | Hosokawa | G01L 9/0054 |
| 2019/0285499 | A1* | 9/2019 | Ikesho | G01L 9/04 |
| 2020/0064952 | A1* | 2/2020 | Gupta | G01L 1/142 |

FOREIGN PATENT DOCUMENTS

JP   H06186104 A   7/1994
WO   WO-2015194105 A1 *  12/2015   ........... G01L 19/147

* cited by examiner

*Primary Examiner* — Andre J Allen

(57) ABSTRACT

A sensor device including: a sensor portion; a casing portion housing the sensor portion; a first adhesive that is provided between the casing portion and the sensor portion; and a second adhesive that is provided between the first adhesive and the sensor portion and has an interface between the first adhesive and the second adhesive is provided. A manufacturing method that is a manufacturing method of the sensor device, the manufacturing method including: providing the first adhesive that is cured or semi-cured, and the second adhesive that is not cured on the first adhesive; mounting the sensor portion on the upper surface of the second adhesive; and curing the second adhesive is provided.

16 Claims, 11 Drawing Sheets

SENSOR DEVICE UTILIZING ADHESIVES AND MANUFACTURING METHOD THEREOF

The contents of the following Japanese patent application(s) are incorporated herein by reference:
NO. 2018-046063 filed in JP on Mar. 13, 2018.

BACKGROUND

1. Technical Field

The present invention relates to a sensor device and a manufacturing method thereof.

2. Related Art

Conventionally, sensor devices including sensor portions connected to casing portions via adhesive are known (refer to Patent Document 1, for example).
Patent Document 1: Japanese Patent Application Publication No. 06-186104
For sensor devices, preferably, an influence of the stress from the casing portion to the sensor portion is smaller.

SUMMARY

The first aspect of the present invention provides a sensor device including: a sensor portion; a casing portion housing the sensor portion; a first adhesive that is provided between the casing portion and the sensor portion; and a second adhesive that is provided between the first adhesive and the sensor portion and has an interface between the first adhesive and the second adhesive.

The first adhesive may have the same material as the second adhesive.

The first adhesive may have a different material from the second adhesive.

The first adhesive may have smaller elastic modulus than the second adhesive.

The first adhesive may have higher viscosity than the second adhesive.

The second adhesive may cover the whole of the first adhesive.

The first adhesive may be thicker than the second adhesive.

The first adhesive and the second adhesive may be provided also outside of the sensor portion in the top view.

The upper surface of the first adhesive may be parallel to a mounting surface of the casing portion. The second adhesive may be in contact with the first adhesive via a surface parallel to the mounting surface.

The second adhesive may have a filler.

The first adhesive may have a filler.

The casing portion may have protrusion portions on a mounting surface of the sensor portion. The first adhesive may be provided on the upper surface of the protrusion portion.

The second aspect of the present invention provides a manufacturing method that is a manufacturing method of the sensor device, the manufacturing method including: providing the first adhesive that is cured or semi-cured, and the second adhesive that is not cured on the first adhesive; mounting the sensor portion on the upper surface of the second adhesive; and curing the second adhesive.

The manufacturing method of the sensor device may further include applying the first adhesive and the second adhesive in the same process.

The manufacturing method of the sensor device may include providing the second adhesive on the first adhesive after curing or semi-curing the first adhesive.

The first adhesive may have a different material from the second adhesive.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1A:
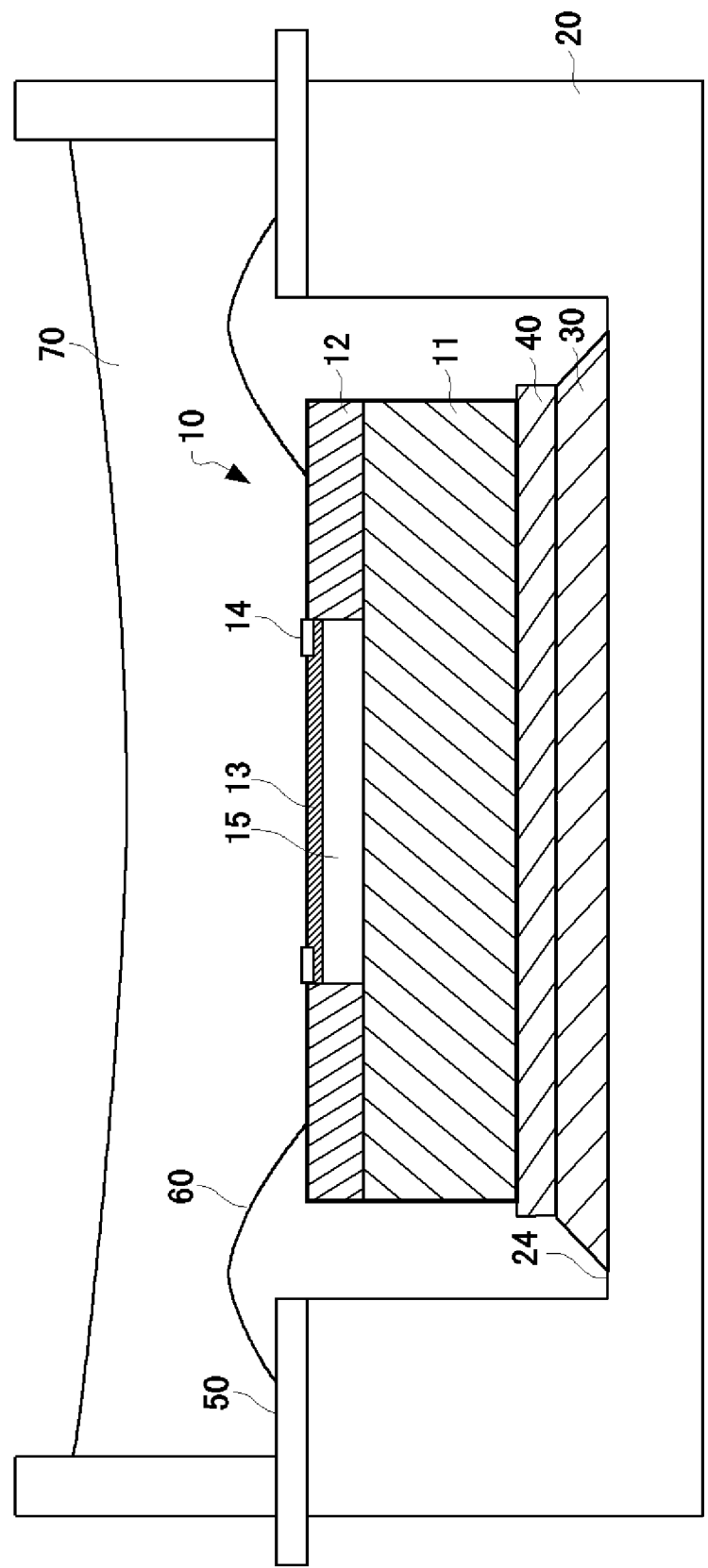
FIG. 1A shows an exemplary cross sectional view of a sensor device 100 according to Embodiment 1.

FIG. 1A shows an exemplary cross sectional view of a sensor device 100 according to Embodiment 1. The sensor device 100 in the present example includes: a sensor portion 10, a casing portion 20, a first adhesive 30, a second adhesive 40, a lead terminal 50, a connection portion 60, and a sealing portion 70.

In the present example, directions orthogonal to each other on a surface parallel to the principal surface of the sensor portion 10 are referred to as X-axis direction and Y-axis direction, and a direction orthogonal to the principal surface of the sensor portion 10 is referred to as Z-axis direction. XYZ axes constitute a right hand system. In the present example, the principal surfaces of the sensor portion 10 include an upper surface on an opposite side of a lower surface facing to the casing portion 20. Note that directions such as upward or downward in the present specification represent relative directions, and they do not necessarily correspond to upward or downward in the direction of gravity, or upward or downward in the direction in which the sensor device 100 is actually mounted.

The sensor portion 10 is a physical quantity sensor to detect predetermined physical quantities. For example, the sensor portion 10 has a physical quantity sensor such as a pressure sensor and an acceleration sensor. In the present example, the sensor portion 10 is described as, but not limited to, a pressure sensor. The sensor portion 10 includes a pedestal portion 11, a sensor chip 12, and a diaphragm 13. The bottom surface of the sensor portion 10 is adhered on the casing portion 20. The bottom surface of the sensor portion 10 may be die-bonded on the casing portion 20 using an adhesive. The side surfaces of the sensor portion 10 are apart from the casing portion 20.

The pedestal portion 11 is jointed with the sensor chip 12 on a positive-side surface in Z-axis direction (i.e. the upper surface). The pedestal portion 11 is adhered on a mounting surface 24 of the casing portion 20 via the first adhesive 30 and the second adhesive 40 on a negative-side surface in Z-axis direction (i.e. the lower surface). For example, the pedestal portion 11 has heat-resistant glass. Preferably, the pedestal portion 11 is carried horizontally on the mounting surface 24.

The sensor chip 12 is a chip for detecting pressure. The sensor chip 12 in the present example is a silicon (Si) chip to detect pressure applied to the sensor portion 10. For example, the sensor chip 12 is electrostatically jointed with the pedestal portion 11.

The diaphragm 13 is deflected due to the applied pressure to the sensor portion 10. The diaphragm 13 has gauge resistor portions 14. The diaphragm 13 is a thin-plate portion of the sensor chip 12 that is obtained by removing some of the back surface. For example, the diaphragm 13 has a circular planar shape. The thickness of the diaphragm 13 is different depending on the range of pressure to measure, but, for example, it is approximately several µm.

The gauge resistor portion 14 outputs an electrical signal depending on the deflection of the diaphragm 13. The gauge resistor portion 14 is formed of a material having piezo resistance effect. Four gauge resistor portions 14 are bridge-connected to each other on the upper surface of the diaphragm 13. For example, the gauge resistances of the gauge resistor portions 14 change due to the deformation of the diaphragm 13 depending on pressure change, and the change amount of the gauge resistance is output by a bridge circuit as a voltage signal.

The space 15 is a region where some of the back surface of the sensor chip 12 is removed to form the diaphragm 13. The space 15 is a space having approximately cylinder shape that is provided in the middle of the sensor chip 12. The space 15 may be formed by the sensor chip 12 being electrostatically jointed to the pedestal portion 11.

The casing portion 20 is a casing container body to house the sensor portion 10 therein. The casing portion 20 has a concave-shaped space to house the sensor portion 10 therein. The casing portion 20 is molded of resin, using a predetermined form. The shape of the casing portion 20 is not limited to the present example.

Here, in addition to the pressure applied from the surrounding environment, stress may be also applied from the casing portion 20 and the adhesives to the diaphragm 13 via the pedestal portion 11. For example, stress is generated due to difference in the thermal expansion between the pedestal portion 11 and the casing portion 20. Preferably, the diaphragm 13 has no influence of stress other than the surrounding environment. Thereby, detection accuracy of pressure of the sensor device 100 improves.

The first adhesive 30 is provided between the sensor portion 10 and the casing portion 20. The first adhesive 30 is cured or semi-cured before mounting the sensor portion 10 thereon.

The second adhesive 40 bonds the sensor portion 10 and the first adhesive 30. The second adhesive 40 is provided between the first adhesive 30 and the sensor portion 10. The second adhesive 40 is cured after mounting the sensor portion 10 thereon. The second adhesive 40 is provided on the upper surface of the first adhesive 30.

The first adhesive 30 has an interface between the second adhesive 40 and the first adhesive 30. For example, the interface between the first adhesive 30 and the second adhesive 40 is generated by curing only the first adhesive 30, after applying the first adhesive 30 and the second adhesive 40 in the same process. The interface between the first adhesive 30 and the second adhesive 40 may be an interface constituted by materials being discontinuously formed between the first adhesive 30 and the second adhesive 40. Note that the interface between the first adhesive 30 and the second adhesive 40 can be checked by cross section observation with electron microscopes or X-ray CT.

The second adhesive 40 absorbs stress generated between the sensor portion 10 and the casing portion 20. The second adhesive 40 is provided in contact with the casing portion 20 between the sensor portion 10 and the casing portion 20. Preferably, the second adhesive 40 is formed of a soft and stretchable material. For example, the second adhesive 40 has smaller elastic modulus than the casing portion 20. The elastic modulus of the second adhesive 40 is smaller than the pedestal portion 11. By making the elastic modulus of the second adhesive 40 smaller, it becomes easier to absorb the stress between the sensor portion 10 and the casing portion 20.

The first adhesive 30 may have the same material as the second adhesive 40. Even though the first adhesive 30 and the second adhesive 40 are formed of the same material, the characteristics may be different from each other between the first adhesive 30 and the second adhesive 40 depending on the cured degree. For example, the first adhesive 30 has higher viscosity than the second adhesive 40.

The first adhesive 30 may have a different material than the second adhesive 40. In an example, the first adhesive 30 has smaller elastic modulus than the second adhesive 40. The first adhesive 30 has a material having smaller density of the crosslinking points to achieve smaller elastic modulus than the second adhesive 40. Since fine polymers are bonded during the first adhesive 30 being cured, the smaller density of the crosslinking points of the first adhesive 30 can result in a smaller elastic modulus.

The first adhesive 30 and the second adhesive 40 include a polymeric material. The first adhesive 30 and the second adhesive 40 may be formed of a silicon-based polymeric material, or a fluorine-based polymeric material. The silicon-based polymeric material is low in cost. The fluorine-based polymeric material is excellent in environment resistance. Preferably, the first adhesive 30 and the second adhesive 40 have relatively less free-oil to achieve higher viscosity. The first adhesive 30 and the second adhesive 40 may be formed of a polymeric material including no free-oil. A free-oil is an additive to adjust physical properties such as elastic modulus, penetration, and hardness. By containing smaller amount of free-oil, the first adhesive 30 and the second adhesive 40 can reduce the wetting and spreading area during die bonding of the sensor portion 10. Thus, it becomes easier to arrange the first adhesive 30 and the second adhesive 40 within a predetermined range of area.

Also, the first adhesive 30 may have higher viscosity than the second adhesive 40. As the viscosity of the first adhesive 30 increases, the first adhesive 30 is less likely to get collapsed during thermal curing. On the other hand, when the first adhesive 30 are flown out to the surrounding and collapsed during thermal curing, the space between the sensor portion 10 and the casing portion 20 may not be able to be sufficiently secured. As such, by making the viscosity of the first adhesive 30 higher, it becomes easier for the first adhesive 30 to be thicker to absorb the stress from the casing portion 20. The first adhesive 30 may be formed of less oil component to make the viscosity higher. The first adhesive 30 may contain no oil component at all. By adjusting the crosslinking agent and the reaction rate, or the like, the first adhesive 30 can adjust the density of the crosslinking point and the viscosity.

The first adhesive 30 may have a filler. When the first adhesive 30 has a filler, the thermal conductivity of the first adhesive 30 improves, which makes it easier for the first adhesive 30 to be cured.

The second adhesive 40 may have a filler. When the second adhesive 40 has a filler, the thermal conductivity of the second adhesive 40 improves, which makes it easier for the second adhesive 40 to be cured. Also, by the second adhesive 40 having a filler, it becomes easier to hold the thickness of the second adhesive 40.

The first adhesive 30 is thicker than the second adhesive 40. The first adhesive 30 is cured or semi-cured before mounting the sensor portion 10 thereon, and thus, it becomes easier for the film thickness to be held at any thickness. When the first adhesive 30 is formed thick, it is only required for the film thickness of the second adhesive 40 to be great enough to bond the sensor portion 10 thereon.

The first adhesive 30 and the second adhesive 40 have a predetermined height to secure a constant space between the sensor portion 10 and the casing portion 20. By making the first adhesive 30 and the second adhesive 40 thicker, it becomes harder for the heat stress from the casing portion 20 to be transferred to the sensor portion 10. The first adhesive 30 may be thicker than the second adhesive 40. It is only required for the second adhesive 40 to be thick so as to bond the first adhesive 30 and the sensor portion 10.

The film thickness of the first adhesive 30 may be greater than or equal to 10 μm, greater than or equal to 100 μm, greater than or equal to 150 μm, or greater than or equal to 200 μm. The film thickness of the first adhesive 30 may be greater than the film thickness of the diaphragm 13.

The film thickness of the second adhesive 40 may be greater than or equal to 3 μm, greater than or equal to 5 μm, greater than or equal to 10 μm, or greater than or equal to 20 μm. The film thickness of the second adhesive 40 may be greater than the film thickness of the diaphragm 13.

The first adhesive 30 is thicker than the second adhesive 40. For example, the ratio of the film thickness of the first adhesive 30 to the film thickness of the second adhesive 40 may be 9:1, 8:2, 7:3, or 6:4.

The first adhesive 30 has a different material from the second adhesive 40. The adhesive strength between the first adhesive 30 and the second adhesive 40 depends on the combination of the first adhesive 30 and the second adhesive 40. Preferably, the material of the first adhesive 30 and the second adhesive 40 are selected such that the adhesive strength therebetween becomes higher.

The second adhesive 40 is in contact with the sealing portion 70. The material of the second adhesive 40 is selected considering compatibility with the sealing portion 70.

The sensor device 100 includes the two layers of adhesive: the first adhesive 30 and the second adhesive 40, but it may also include three or more layers of adhesive. The plurality of adhesives may be selected such that they have good compatibility with each other between the respective layers.

The upper surface of the first adhesive 30 is parallel to the mounting surface 24 of the casing portion 20. In this case, the second adhesive 40 is in contact with the first adhesive 30 via a surface parallel to the mounting surface 24. However, the second adhesive 40 may be provided also on the side surface of the first adhesive 30.

The lead terminals 50 may be insert molded integrally with the casing portion 20. One end portions of the lead terminals 50 are positioned inside of the casing portion 20 and exposed. The other end portion of the lead terminal 50 is exposed outside of the casing portion 20. The arrangement of the lead terminal 50 is not limited to this. The lead terminal 50 includes a conductive material such as copper.

The connection portion 60 electrically connects the sensor portion 10 and the lead terminal 50. The connection portion 60 may be connected to the sensor portion 10 and the lead terminal 50 via a pad. For example, the connection portion 60 is a bonding wire including at least one of gold, silver, copper, aluminum, and alloys thereof.

The sealing portion 70 is a pressure medium to transfer pressure to the sensor portion 10. The sealing portion 70 pushes the diaphragm 13 toward the pedestal portion 11 upon the atmospheric pressure and the stress being larger than the usual (e.g. the displacement of the diaphragm 13 is zero). Upon the diaphragm 13 being deflected, the gauge resistor portions 14 are compressed and the resistance values of the gauge resistor portions 14 become greater. On the other hand, upon the atmospheric pressure and the stress applied on the sealing portion 70 being smaller than the usual, the gauge resistor portions 14, together with the diaphragm 13, are pulled out in a direction leaving from the pedestal portion 11, and the resistance values of the gauge resistor portions 14 become smaller. Thereby, the sensor device 100 detects the applied pressure.

The sensor device 100 in the present example includes the first adhesive 30 that is cured or semi-cured before mounting the sensor portion 10 thereon. Thereby, it becomes easier for the sensor device 100 to secure a space between the sensor portion 10 and the casing portion 20, which allows the total film thicknesses of the first adhesive 30 and the second adhesive 40 to be greater. Thus, the sensor device 100 can prevent or reduce variation in the output due to the change in the heat stress of the casing portion 20. The sensor device 100 can also reduce the influence of the heat stress of the casing portion 20 due to over-time change.

Figure 1B:
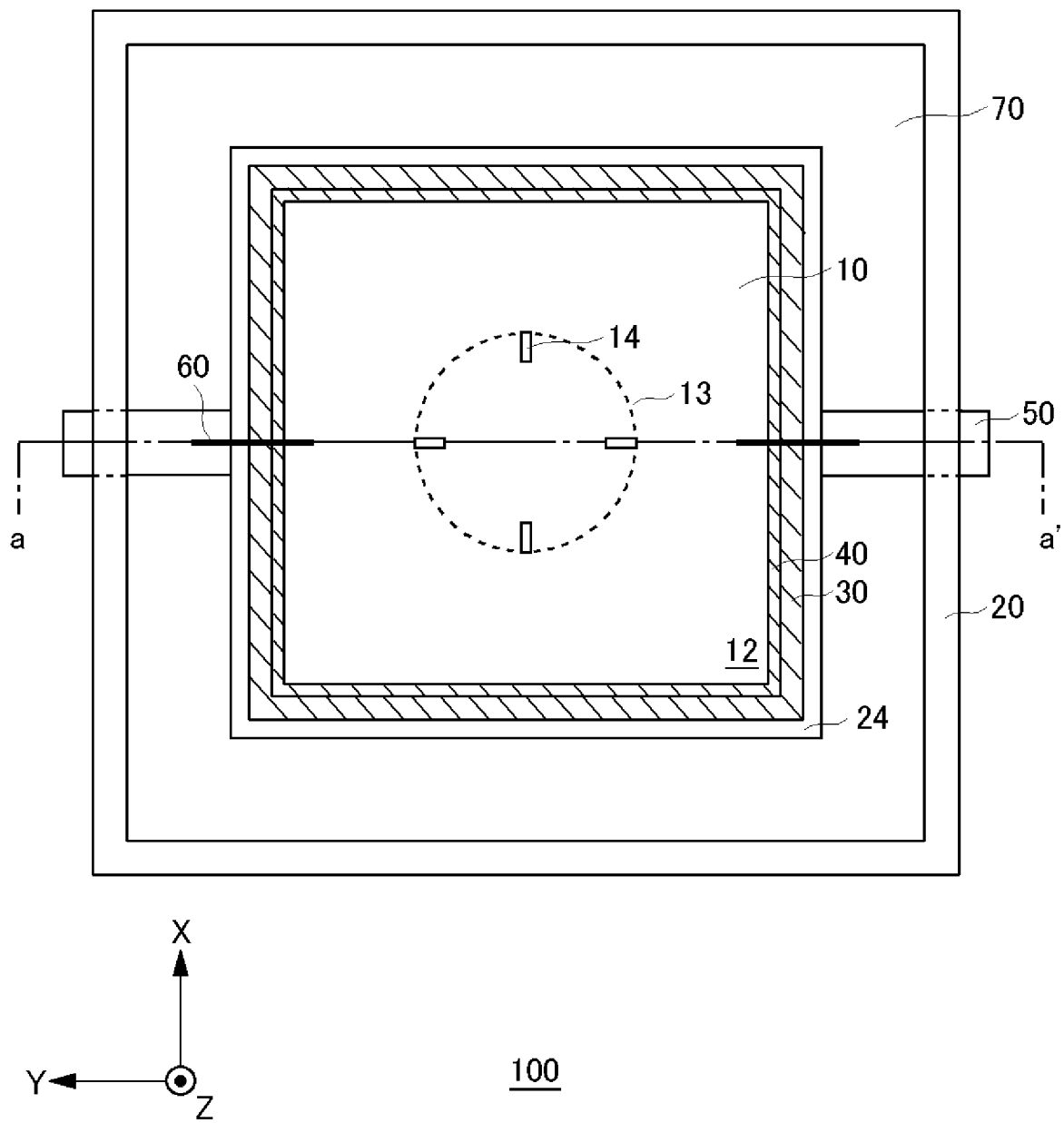
FIG. 1B shows an exemplary top view of the sensor device 100 according to Embodiment 1.

FIG. 1B shows an exemplary top view of the sensor device 100 according to Embodiment 1. The a-a' cross section is a YZ cross section passing through the center of the sensor device 100. FIG. 1A is an exemplary a-a' cross section.

The first adhesive 30 is provided also outside of the sensor portion 10 in the top view. The second adhesive 40 is provided also outside of the sensor portion 10 in the top view. Preferably, the first adhesive 30 and the second adhesive 40 are evenly arranged around the diaphragm 13. Thereby, the heat stress from the casing portion 20 becomes uniform regardless of the direction. Also, it becomes harder for the heat stress of the casing portion 20 to give a negative influence on output characteristics of the sensor device 100.

The sensor portion 10 has a squared planar shape. However, the planar shape of the sensor portion 10 may have a rectangular or another shape. When the planar shape of the sensor portion 10 has a circular or ellipsoidal shape, there is no corner portion into which resin is hard to flow during the casing portion 20 being formed, and thus defective molding of the casing portion 20 can be reduced.

The mounting surface 24 has a planar shape corresponding to the planar shape of the sensor portion 10. The mounting surface 24 in the present example, like the sensor portion 10, has a squared planar shape. The mounting surface 24 may have a planar shape different from the planar shape of the sensor portion 10. Preferably, the planar shape of the mounting surface 24 is set such that the influence of the stress to the sensor portion 10 is small, and an influence on the stress to the sensor portion 10 is equal regardless of the directions.

Figure 2:
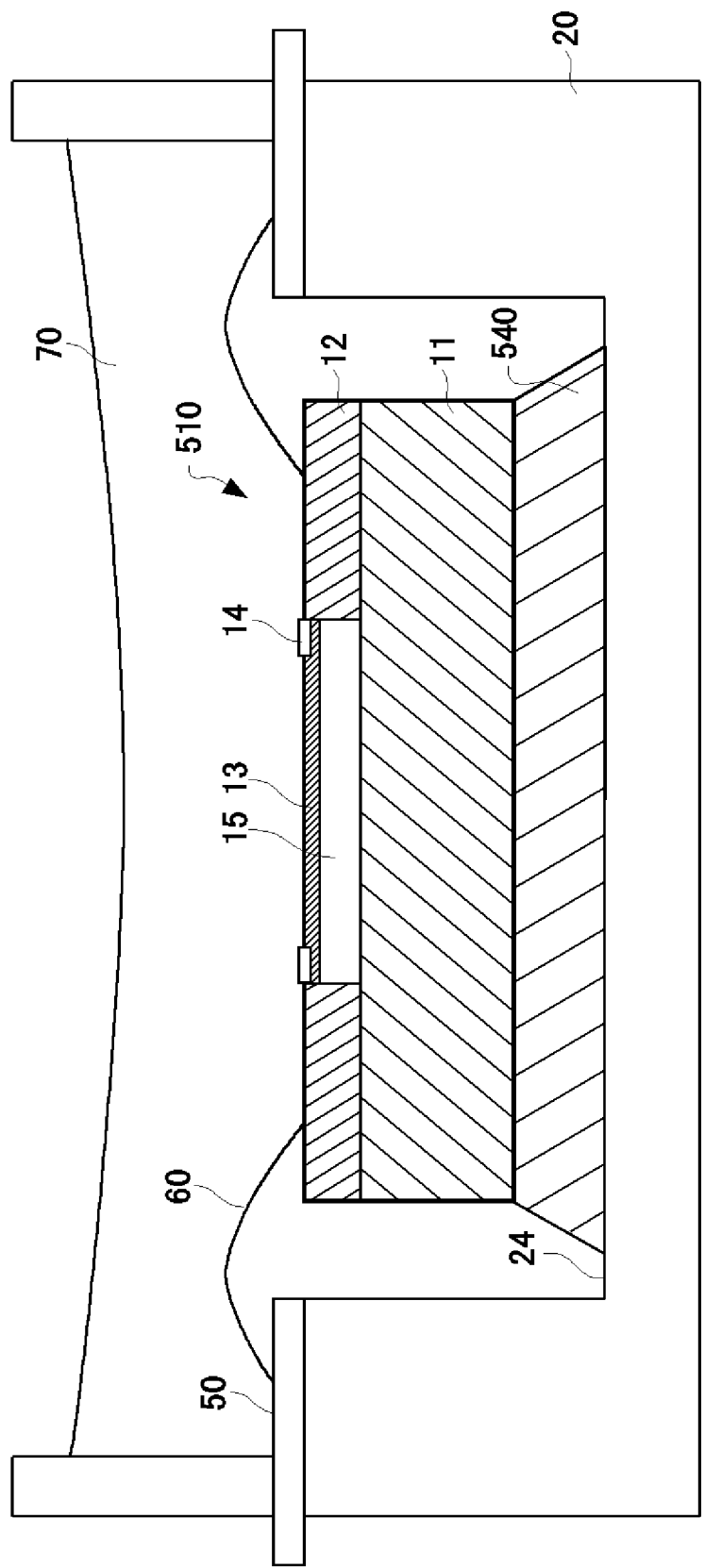
FIG. 2 shows an exemplary cross sectional view of a sensor device 500 according to Comparative Example.

FIG. 2 shows an exemplary cross sectional view of a sensor device 500 according to Comparative Example. The sensor device 500 in the present example is different from the sensor device 100 according to Embodiment 1 in that the sensor device 500 has the adhesive 540, instead of the first adhesive 30 and the second adhesive 40.

The adhesive 540 is provided between the sensor portion 510 and the casing portion 20. The adhesive 540 bonds the sensor portion 510 and the casing portion 20. The adhesive 540 is cured after mounting the sensor portion 510 thereon. In this case, curing shrinkage may occur during the adhesive 540 being cured, or the adhesive 540 may be squashed during the sensor portion 510 being mounted. Thus, it is difficult to control the film thickness of the adhesive 540. Thus, it is difficult to control the distance constant between the sensor portion 510 and the casing portion 20, which makes it easier for the influence of the heat stress from the casing portion 20 to be transferred to the sensor portion 510. Thus, the variation in the output of the sensor device 500 cannot be prevented or reduced, which worsens the detection accuracy.

On the other hand, in the sensor device 100 according to Embodiment 1, the first adhesive 30 is cured or semi-cured before mounting the sensor portion 10 thereon. Thereby, the thickness of the first adhesive 30 is secured, and thus, the stress from the casing portion 20 to the sensor portion 10 is hard to be transferred. Thus, the variation in the output of the sensor device 100 is prevented or reduced.

Figure 3A:
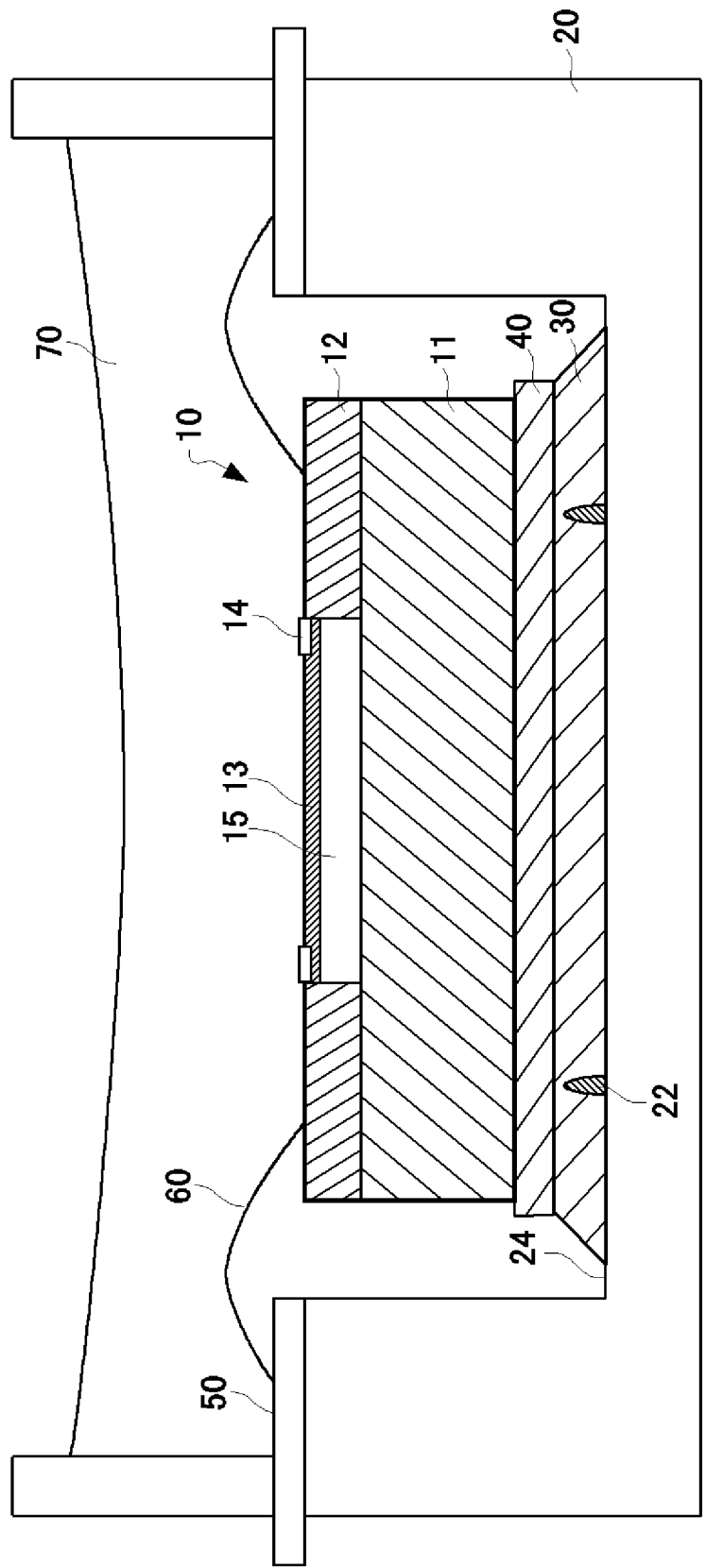
FIG. 3A shows an exemplary cross sectional view of a sensor device 100 according to Embodiment 2.

FIG. 3A shows an exemplary cross sectional view of a sensor device 100 according to Embodiment 2. The sensor device 100 in the present example is different from the sensor device 100 according to Embodiment 1 in that the sensor device 100 has protrusion portions 22.

The protrusion portions 22 are provided on the mounting surface 24. The protrusion portions 22 are provided extending from the mounting surface 24 of the casing portion 20 in a predetermined direction. The protrusion portions 22 are provided within the first adhesive 30. By providing the protrusion portions 22, it becomes easier to hold the shape of the first adhesive 30 during the curing. By making the shape of the first adhesive 30 stable, the protrusion portions 22 make it easier to hold the sensor portion 10 horizontally. Also, by providing the protrusion portions 22, the first adhesive 30 can be stably cured.

The protrusion portions 22 may be provided being formed of the same material as the casing portion 20. In this case, the protrusion portions 22 may be molded integrally with the casing portion 20. Also, the protrusion portions 22 may be formed of the same material as the first adhesive 30 and the second adhesive 40. The first adhesive 30 may cover the surrounding of the protrusion portions 22. That is, the first adhesive 30 is provided on the upper surfaces of the protrusion portions 22. Then, the second adhesive 40 is provided between the upper surface of the protrusion portions 22 and the sensor portion 10.

In an example, the height of the protrusion portion 22 may be greater than or equal to 10 μm, greater than or equal to 100 μm, greater than or equal to 150 μm, or greater than or equal to 200 μm. However, preferably, the height of the protrusion portion 22 is desired to be smaller than the thickness of the first adhesive 30.

Figure 3B:
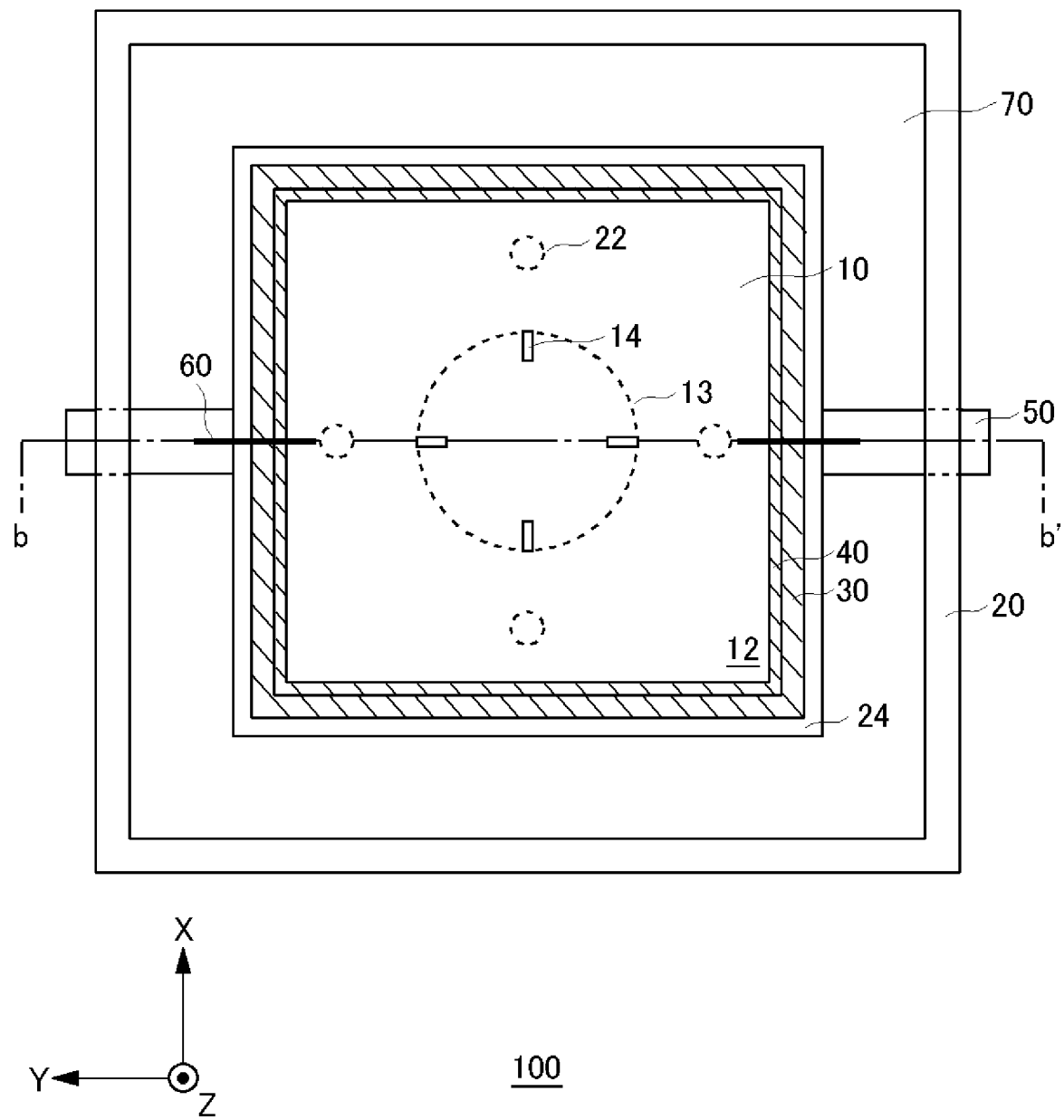
FIG. 3B shows an exemplary top view of the sensor device 100 according to Embodiment 2.

FIG. 3B shows an exemplary top view of the sensor device 100 according to Embodiment 2. However, the arrangement and the number of the protrusion portions 22 are not limited to those in the present example. The b-b' cross section is a YZ cross section passing through the center of the sensor device 100.

Preferably, the protrusion portions 22 are provided outside of the diaphragm 13 in the top view. The protrusion portions 22 are evenly arranged around the diaphragm 13. Thereby, it becomes easier to adjust output voltage of the sensor device 100. Also, it becomes harder to give a negative influence on output characteristics of the sensor device 100. More specifically, the protrusion portions 22 may be arranged outside of the diaphragm 13 in the top view, for example, at approximately regular intervals along the outer circumference of the diaphragm 13.

The protrusion portions 22 are provided evenly under the sensor portion 10. For example, a plurality of the protrusion portions 22 are provided so as to be point-symmetrical to each other about the center of the diaphragm 13 in the top view. Thereby, it becomes easier for the sensor portion 10 to be carried horizontally. Also, an influence of the stress from the casing portion 20 to the sensor portion 10 becomes uniform regardless of the direction thereof, and thus the variation in the output of the sensor device 100 can become smaller.

Figure 4A:
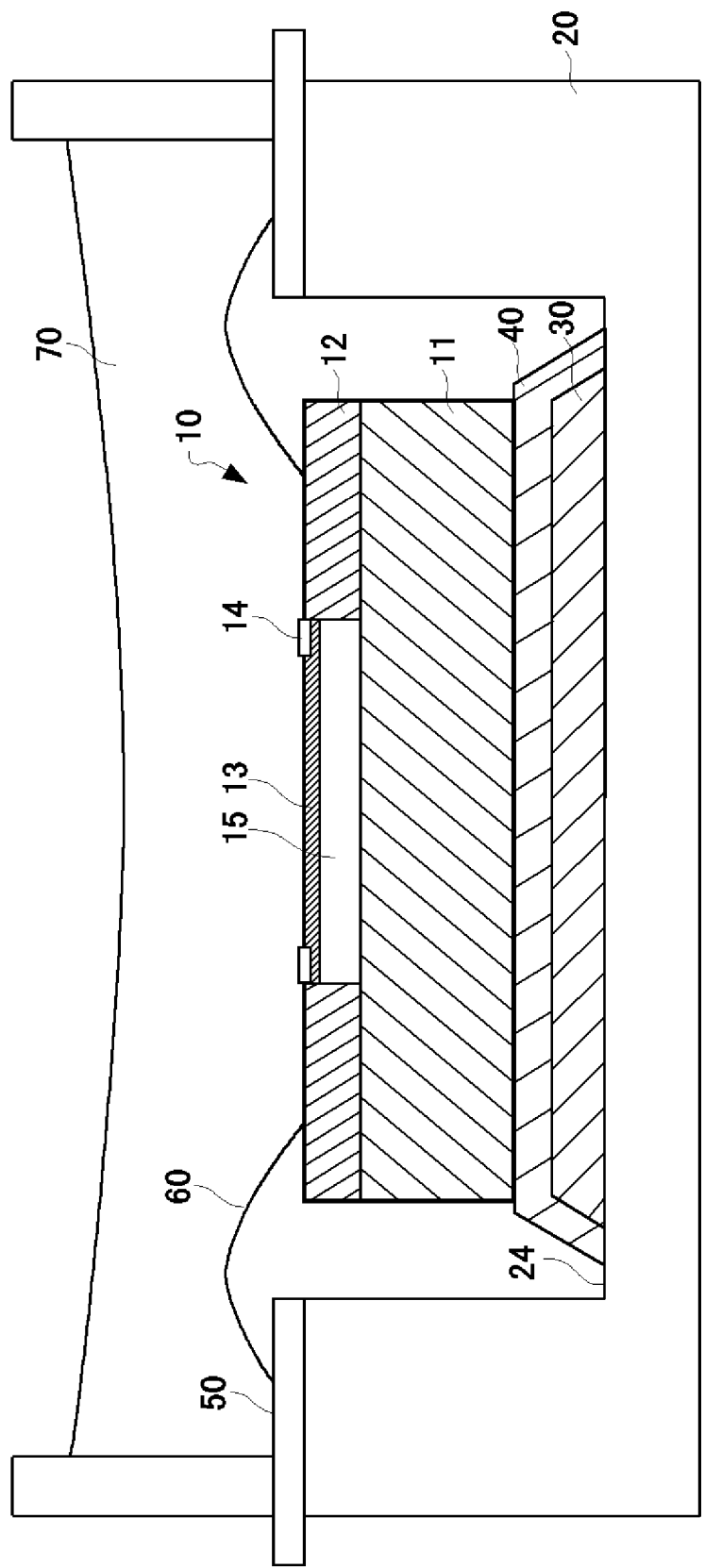
FIG. 4A shows an exemplary cross sectional view of a sensor device 100 according to Embodiment 3.

FIG. 4A shows an exemplary cross sectional view of a sensor device 100 according to Embodiment 3. The sensor device 100 in the present example is different from the sensor device 100 according to Embodiment 1 in that the second adhesive 40 covers the whole of the first adhesive 30.

The second adhesive 40 is provided on the first adhesive 30. The second adhesive 40 covers the upper surface and the side surface of the first adhesive 30. By the second adhesive 40 covering the whole of the first adhesive 30, the first adhesive 30 becomes not in contact with the sealing portion 70. Thus, without limitation of compatibility with the sealing portion 70, the material of the first adhesive 30 can be selected. Preferably, the second adhesive 40 covers the first adhesive 30 with a material having good compatibility with the sealing portion 70. The film thickness of the second adhesive 40 may be smaller than the film thickness of the first adhesive 30.

Note that the sensor device 100 in the present example may be used, combined with other embodiments. For example, the sensor device 100 may include the protrusion portions 22 within the first adhesive 30.

Figure 4B:
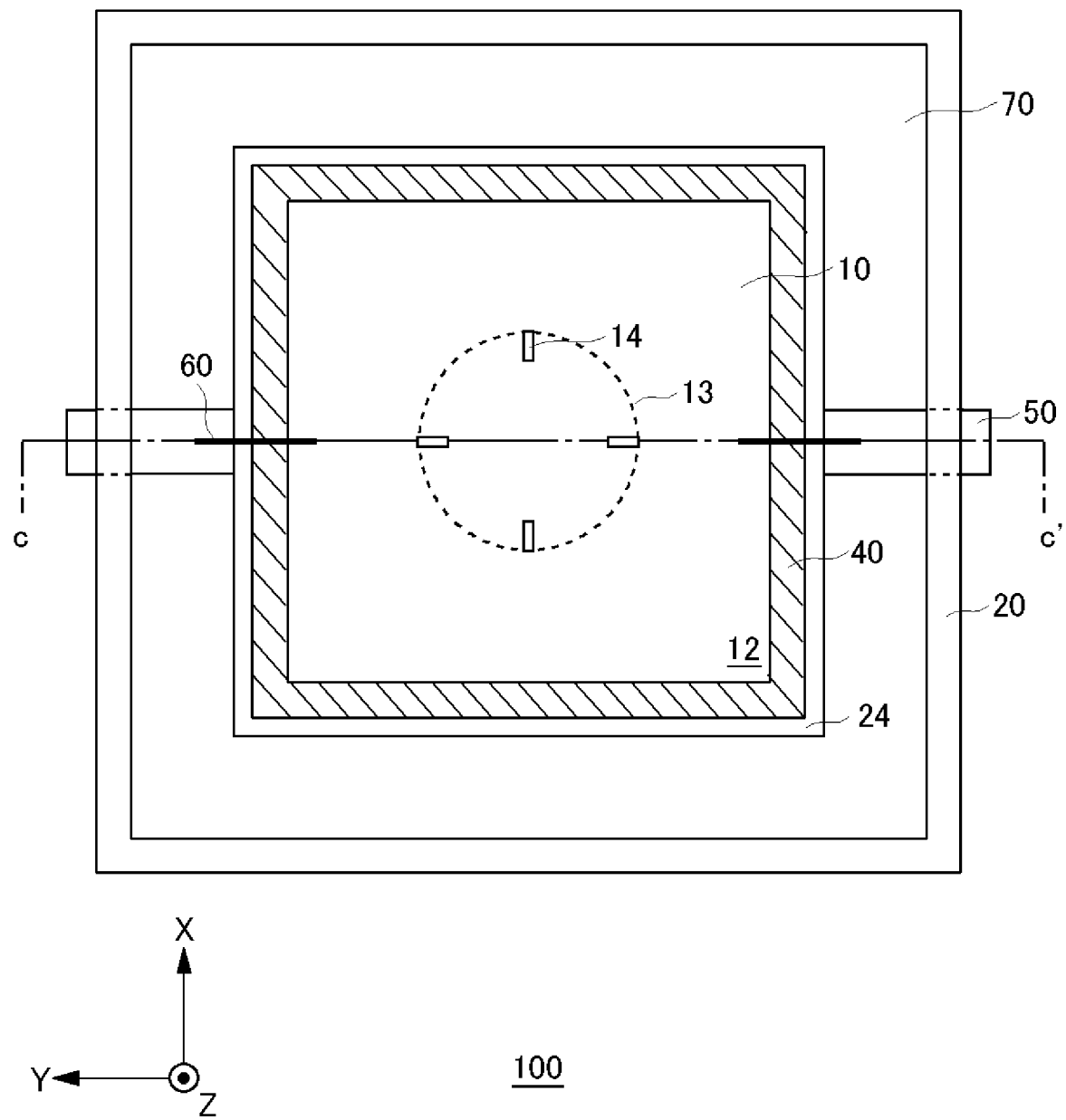
FIG. 4B shows an exemplary top view of the sensor device 100 according to Embodiment 3.

FIG. 4B shows an exemplary top view of the sensor device 100 according to Embodiment 3. The c-c' cross section is a YZ cross section passing through the center of the sensor device 100.

The second adhesive 40 covers the whole of the first adhesive 30. The second adhesive 40 in the present example covers the whole surface of the first adhesive 30, and thus the first adhesive 30 is not exposed. The second adhesive 40 is provided also outside of the sensor portion 10 in the top view. When the second adhesive 40 applied, it may be applied so as to cover the whole of the first adhesive 30.

Also, after being applied on the upper surface of the first adhesive 30, the second adhesive 40 may be cured by heating so as to cover the whole of the first adhesive 30.

Preferably, the first adhesive 30 and the second adhesive 40 are evenly arranged around the diaphragm 13. Thereby, the heat stress from the casing portion 20 becomes uniform regardless of the direction. Also, it becomes harder for the heat stress of the casing portion 20 to give a negative influence on output characteristics of the sensor device 100.

Figure 5A:
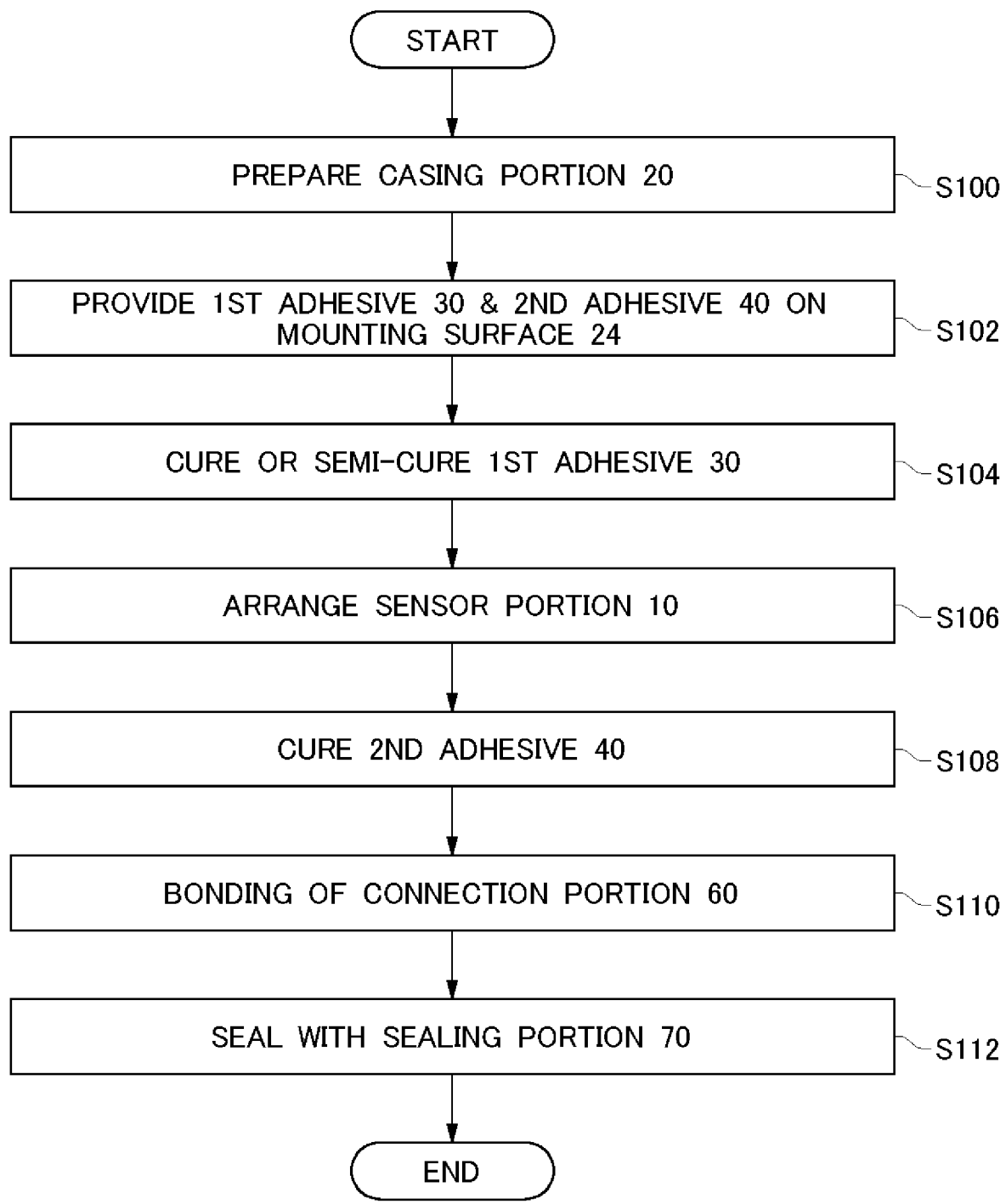
FIG. 5A shows an exemplary flowchart for manufacturing the sensor device 100.

FIG. 5A shows an exemplary flowchart for manufacturing the sensor device 100. The manufacturing method in the present example is an example, and the sensor device 100 may be manufactured by other manufacturing method flowchart.

Prepare the casing portion 20 (S100). The casing portion 20 may be provided by being molded of resin. Provide the first adhesive 30 and the second adhesive 40 on the mounting surface 24 of the casing portion 20 (S102). The first adhesive 30 and the second adhesive 40 in the present example are applied at the same time. The second adhesive 40 is provided on the first adhesive 30.

Cure or semi-cure the first adhesive 30 (S104). First adhesive 30 is held in a predetermined shape by curing or semi-curing. Preferably, the first adhesive 30 is cured so as not to be collapsed upon the second adhesive 40 being applied or the sensor portion 10 being mounted. Even when the second adhesive 40 is applied with the same material as the first adhesive 30 by curing or semi-curing the first adhesive 30, an interface between the first adhesive 30 and the second adhesive 40 is formed. On the other hand, the second adhesive 40 is not cured on the first adhesive 30.

Then, arrange the sensor portion 10 on the second adhesive 40 (S106). Preferably, the first adhesive 30 is not in direct contact with the sensor portion 10. Cure the second adhesive 40 (S108). As such, the present example has the two thermal curing steps: Step S104 and Step S108. Note that, in the manufacturing process of the sensor device 100, three or more thermal curings may be executed.

By wire bonding of the connection portion 60, the sensor portion 10 and the lead terminal 50 are electrically connected (S110). Finally, seal the sensor portion 10 with the sealing portion 70 (S112).

Figure 5B:
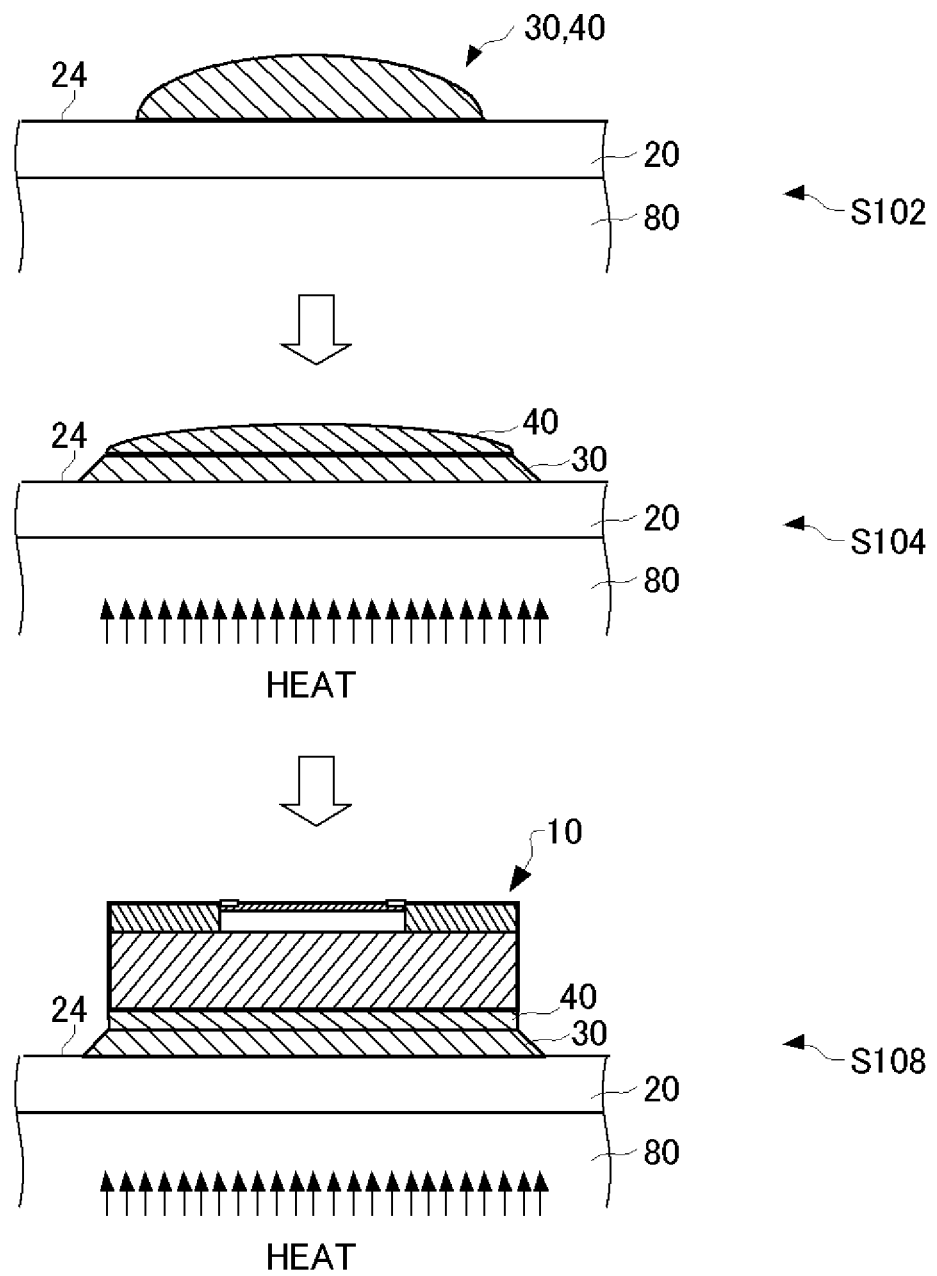
FIG. 5B shows an exemplary specific configuration when the manufacturing method shown in FIG. 5A is used.

FIG. 5B shows an exemplary specific configuration when the manufacturing method shown in FIG. 5A is used. The casing portion 20 is provided on the upper surface of the heating portion 80.

By heating the casing portion 20, the heating portion 80 cures or semi-cures the first adhesive 30 and the second adhesive 40. The first adhesive 30 and the second adhesive 40 are heated by thermal conduction of the casing portion 20. For example, the heating portion 80 is a hot plate. By adjusting heating time or heating intensity, the heating portion 80 can adjust the curing speed of the first adhesive 30 and the second adhesive 40. The heating portion 80 in the present example conducts heating after applying the first adhesive 30 and the second adhesive 40. However, the heating portion 80 may apply the first adhesive 30 and the second adhesive 40 after heating the casing portion 20.

In Step S104, the heating portion 80 cures or semi-cures only the first adhesive 30, among the first adhesive 30 and the second adhesive 40, that should be cured before mounting the sensor portion 10. In this case, preferably, the heating portion 80 conducts heating such that the first adhesive 30 is uniformly cured or semi-cured. For example, that the first adhesive 30 is uniformly cured or semi-cured refers to that the upper surface of the first adhesive 30 is parallel to the mounting surface 24.

In Step S108, the heating portion 80 heats the second adhesive 40 having the sensor portion 10 mounted thereon and cures it. Thereby, the sensor portion 10 is bonded on the casing portion 20.

As described above, in the manufacturing method in the present example, the first adhesive 30, which is a part of the adhesive, is cured before mounting the sensor portion 10, and the remaining second adhesive 40 is cured after mounting the sensor portion 10. In the manufacturing method in the present example, the thickness of the first adhesive 30 that is cured or semi-cured before mounting the sensor portion 10 is secured. Thereby, the adhesive can be selected from wider options.

Figure 6A:
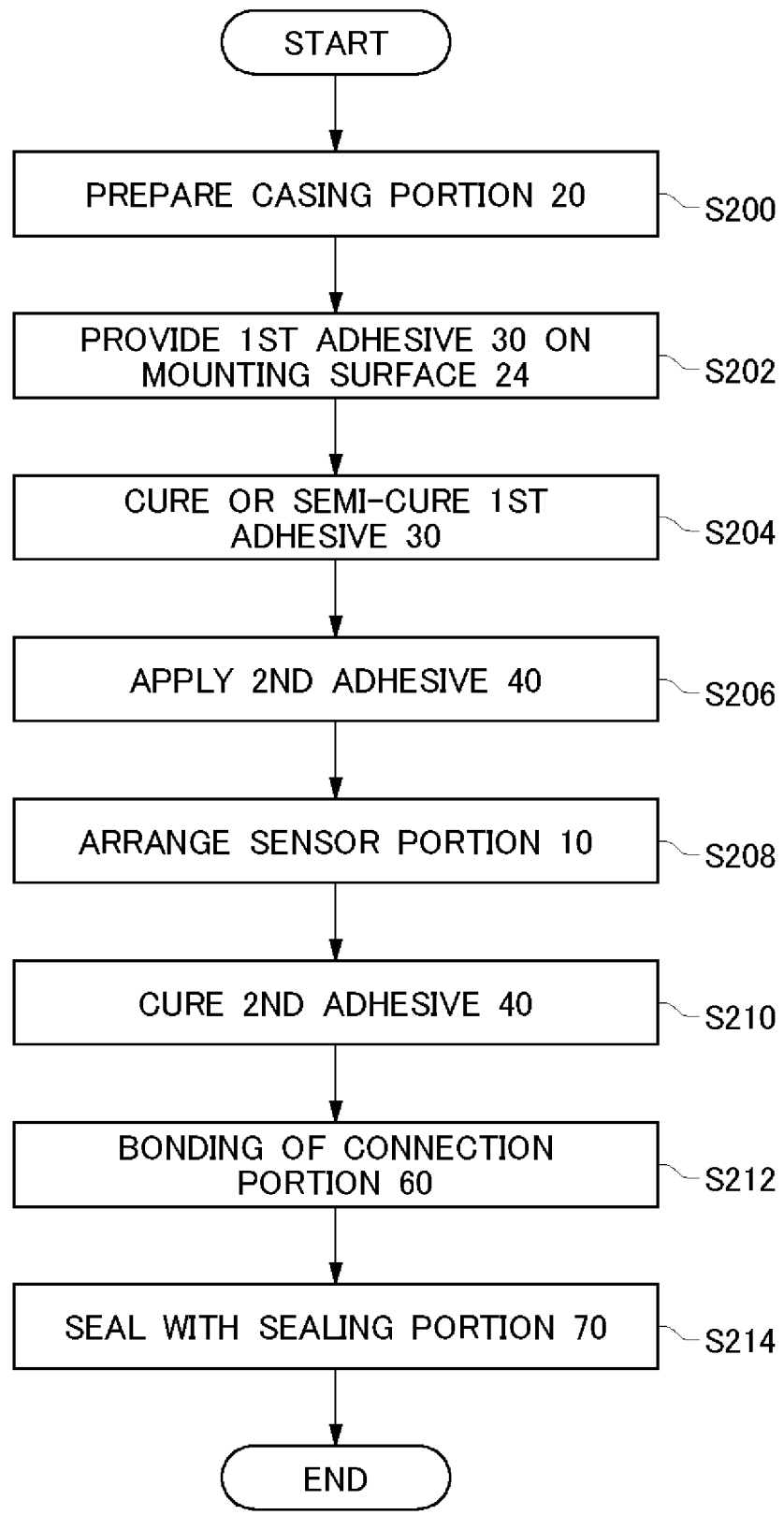
FIG. 6A shows an exemplary flowchart for manufacturing the sensor device 100.

FIG. 6A shows an exemplary flowchart for manufacturing the sensor device 100. The manufacturing method in the present example is an example, and the sensor device 100 may be manufactured by other manufacturing method flowchart.

Prepare the casing portion 20 (S200). The casing portion 20 may be provided by being molded of resin. Provide the first adhesive 30 on the mounting surface 24 of the casing portion 20 (S202). The first adhesive 30 and the second adhesive 40 in the present example are applied separately.

Cure or semi-cure the first adhesive 30 (S204). First adhesive 30 is held in a predetermined shape by curing or semi-curing. Preferably, the first adhesive 30 has a film thickness great enough to absorb the heat stress from the casing portion 20. The first adhesive 30 is cured so as not to be collapsed upon the second adhesive 40 being applied or the sensor portion 10 being mounted. Even when the second adhesive 40 is applied with the same material as the first adhesive 30 by curing or semi-curing the first adhesive 30, an interface between the first adhesive 30 and the second adhesive 40 is formed.

Then, apply the second adhesive 40 on the first adhesive 30 (S206). As such, the second adhesive 40 is applied after the first adhesive 30 is cured or semi-cured. The second adhesive 40 may be formed of the same material as or a different material from the first adhesive 30. Arrange the sensor portion 10 on the second adhesive 40 (S208). Preferably, the first adhesive 30 is not in direct contact with the sensor portion 10. Cure the second adhesive 40 (S210). As such, the present example has the two thermal curing steps: Step S204 and Step S210. Note that, three or more thermal curings may be executed.

By wire bonding of the connection portion 60, the sensor portion 10 and the lead terminal 50 are electrically connected (S212). Finally, seal the sensor portion 10 with the sealing portion 70 (S214).

Figure 6B:
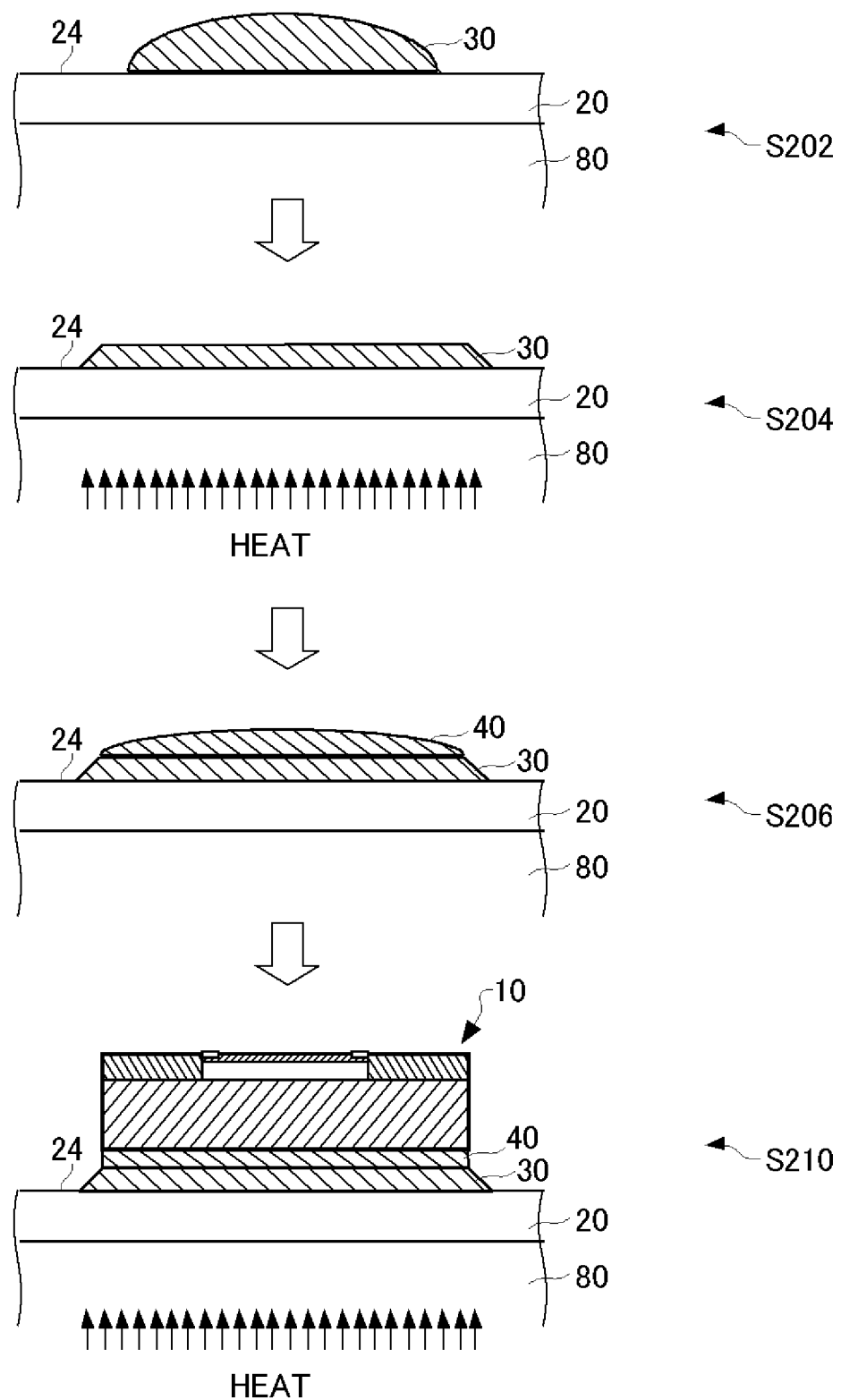
FIG. 6B shows an exemplary specific configuration when the manufacturing method shown in FIG. 6A is used.

FIG. 6B shows an exemplary specific configuration when the manufacturing method shown in FIG. 6A is used. The casing portion 20 is provided on the upper surface of the heating portion 80.

In Step S202, apply the first adhesive 30 on the mounting surface 24 of the casing portion 20. In Step S204, the heating portion 80 cures or semi-cures the first adhesive 30. In this case, preferably, the heating portion 80 conducts heating such that the first adhesive 30 is uniformly cured or semi-cured. For example, that the first adhesive 30 is uniformly cured or semi-cured refers to that the upper surface of the first adhesive 30 is parallel to the mounting surface 24.

In Step S206, the second adhesive 40 is provided on the upper surface of the first adhesive 30. In Step S210, the heating portion 80 heats the second adhesive 40 having the sensor portion 10 mounted thereon and cures it. Thereby, the sensor portion 10 is bonded on the casing portion 20.

As described above, in the manufacturing method in the present example, the first adhesive 30 is cured before mounting the sensor portion 10, and the remaining second adhesive 40 is applied and cured after mounting the sensor portion 10. In the manufacturing method in the present example, the thickness of the first adhesive 30 that is cured or semi-cured before mounting the sensor portion 10 is secured. Thereby, the adhesive can be selected from wider options.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A sensor device comprising:
    a sensor portion;
    a casing portion housing the sensor portion;
    a first adhesive that is provided between the casing portion and the sensor portion; and
    a second adhesive that is provided between the first adhesive and the sensor portion and has an interface between the first adhesive and the second adhesive.
2. The sensor device according to claim 1, wherein the first adhesive has a same material as the second adhesive.
3. The sensor device according to claim 1, wherein the first adhesive has a different material from the second adhesive.
4. The sensor device according to claim 3, wherein the first adhesive has smaller elastic modulus than the second adhesive.
5. The sensor device according to claim 1, wherein the first adhesive has higher viscosity than the second adhesive.
6. The sensor device according to claim 1, wherein the second adhesive covers a whole of the first adhesive.
7. The sensor device according to claim 1, wherein the first adhesive is thicker than the second adhesive.
8. The sensor device according to claim 1, wherein the first adhesive and the second adhesive are provided also outside of the sensor portion in a top view.
9. The sensor device according to claim 1, wherein an upper surface of the first adhesive is parallel to a mounting surface of the casing portion, and the second adhesive is in contact with the first adhesive via a surface parallel to the mounting surface.
10. The sensor device according to claim 1, wherein the second adhesive has a filler.
11. The sensor device according to claim 1, wherein the first adhesive has a filler.
12. The sensor device according to claim 1, wherein the casing portion has a protrusion portion on a mounting surface thereof for the sensor portion, and the first adhesive is provided on an upper surface of the protrusion portion.
13. A manufacturing method that is a manufacturing method of a sensor device, the manufacturing method comprising:
    providing a first adhesive that is cured or semi-cured, and a second adhesive that is not cured on the first adhesive;
    mounting a sensor portion on an upper surface of the second adhesive; and
    curing the second adhesive.
14. The manufacturing method according to claim 13, further comprising
    applying the first adhesive and the second adhesive in a same process.
15. The manufacturing method according to claim 13, comprising
    providing the second adhesive on the first adhesive after curing or semi-curing the first adhesive.
16. The manufacturing method according to claim 13, wherein
    the first adhesive has a different material from the second adhesive.

* * * * *